United States Patent
Rust et al.

(10) Patent No.: US 7,043,317 B1
(45) Date of Patent: May 9, 2006

(54) SEMICONDUCTOR WAFER FABRICATION FURNACE IDLE MONITOR AND METHOD OF OPERATION

(75) Inventors: Darren Lee Rust, Arlington, TX (US); George W. Logsdon, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 162 days.

(21) Appl. No.: 10/698,007

(22) Filed: Oct. 30, 2003

(51) Int. Cl.
*G06F 19/00* (2006.01)
*H01H 43/00* (2006.01)

(52) U.S. Cl. .................. 700/99; 700/121; 700/306
(58) Field of Classification Search ............... 700/99, 700/100, 108, 121, 209, 306; 702/176, 177
See application file for complete search history.

(56) References Cited

U.S. PATENT DOCUMENTS

| | | | |
|---|---|---|---|
| 3,858,548 A * | 1/1975 | Tick | 118/724 |
| 6,957,114 B1 * | 10/2005 | Logsdon et al. | 700/100 |
| 6,959,225 B1 * | 10/2005 | Logsdon et al. | 700/100 |
| 2003/0171972 A1 * | 9/2003 | Heskin | 705/9 |
| 2004/0243268 A1 * | 12/2004 | Hsieh et al. | 700/108 |

* cited by examiner

*Primary Examiner*—Leo Picard
*Assistant Examiner*—Ryan Jarrett

(57) ABSTRACT

A system and method is disclosed for monitoring each of a plurality of furnaces in a furnace process in semiconductor wafer fabrication. A furnace that is left open too long will absorb moisture from the atmosphere and should not be used for a furnace task. The system of the invention comprises a furnace resource allocator that comprises a furnace idle timer unit that keeps track of how long each furnace has been open. If the idle time for a selected furnace exceeds a predetermined limit, that furnace is rejected and another furnace is selected for use. Each furnace that is rejected is subjected to a furnace cycle purge process to remove moisture from the furnace so that the furnace may again be available for use.

22 Claims, 4 Drawing Sheets

SEMICONDUCTOR WAFER FABRICATION FURNACE IDLE MONITOR AND METHOD OF OPERATION

TECHNICAL FIELD OF THE INVENTION

The present invention is directed generally to semiconductor wafer fabrication processes, and, more specifically, to a system and method for monitoring a plurality of semiconductor wafer fabrication furnaces to determine which of the furnaces have been idle too long to be used for a furnace task.

BACKGROUND OF THE INVENTION

During the process of manufacturing semiconductor wafers, a semiconductor wafer lot is heated in a semiconductor wafer furnace for a predetermined period of time. It is critical that a semiconductor wafer furnace not be left open to the atmosphere for an extended period of time between furnace tasks. This is because the furnace will absorb too much moisture from the atmosphere to operate properly.

Any furnace that is left open to the atmosphere too long must undergo a furnace cycle purge process to remove the absorbed atmospheric moisture before that furnace may again be used to heat semiconductor wafer lots. If a furnace is not left open too long, the furnace may be used again without having to undergo a furnace cycle purge process.

Therefore, a need exists in the art for a system and method that is capable of efficiently determining how long a semiconductor wafer fabrication furnace has been idle. A need also exists in the art for a system and method that is capable of efficiently monitoring a plurality of semiconductor wafer furnaces during a semiconductor wafer fabrication process that allocates a plurality of furnaces to a plurality of furnace tasks.

BRIEF DESCRIPTION OF THE DRAWINGS

For a more complete understanding of the present invention, and the advantages thereof, reference is made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document, are by way of illustration only and should not be construed in any way to limit the scope of the invention. Those skilled in the art will understand that the principles of the present invention may be implemented in any suitably arranged semiconductor wafer fabrication system.

Before undertaking the Detailed Description of the Invention, it may be advantageous to set forth a definition of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, coupled to or with, be communicable with, cooperate with, interleave, juxtapose, be proximate to, be bound to or with, have, have a property of, or the like; the term "memory" means any storage device, combination of storage devices, or part thereof whether centralized or distributed, whether locally or remotely; and the terms "controller," "processor" and "allocator" mean any device, system or part thereof that controls at least one operation, such a device, system or part thereof may be implemented in hardware, firmware or software, or some combination of at least two of the same.

It should be noted that the functionality associated with any particular controller or allocator may be centralized or distributed, whether locally or remotely. In particular, a controller or allocator may comprise one or more data processors, and associated input/output devices and memory that execute one or more application programs and/or an operating system program.

Additional definitions for certain words and phrases are provided throughout this patent document, those of ordinary skill in the art should understand that in many, if not most instances, such definitions apply to prior uses, as well as to future uses, of such defined words and phrases.

Figure 1:
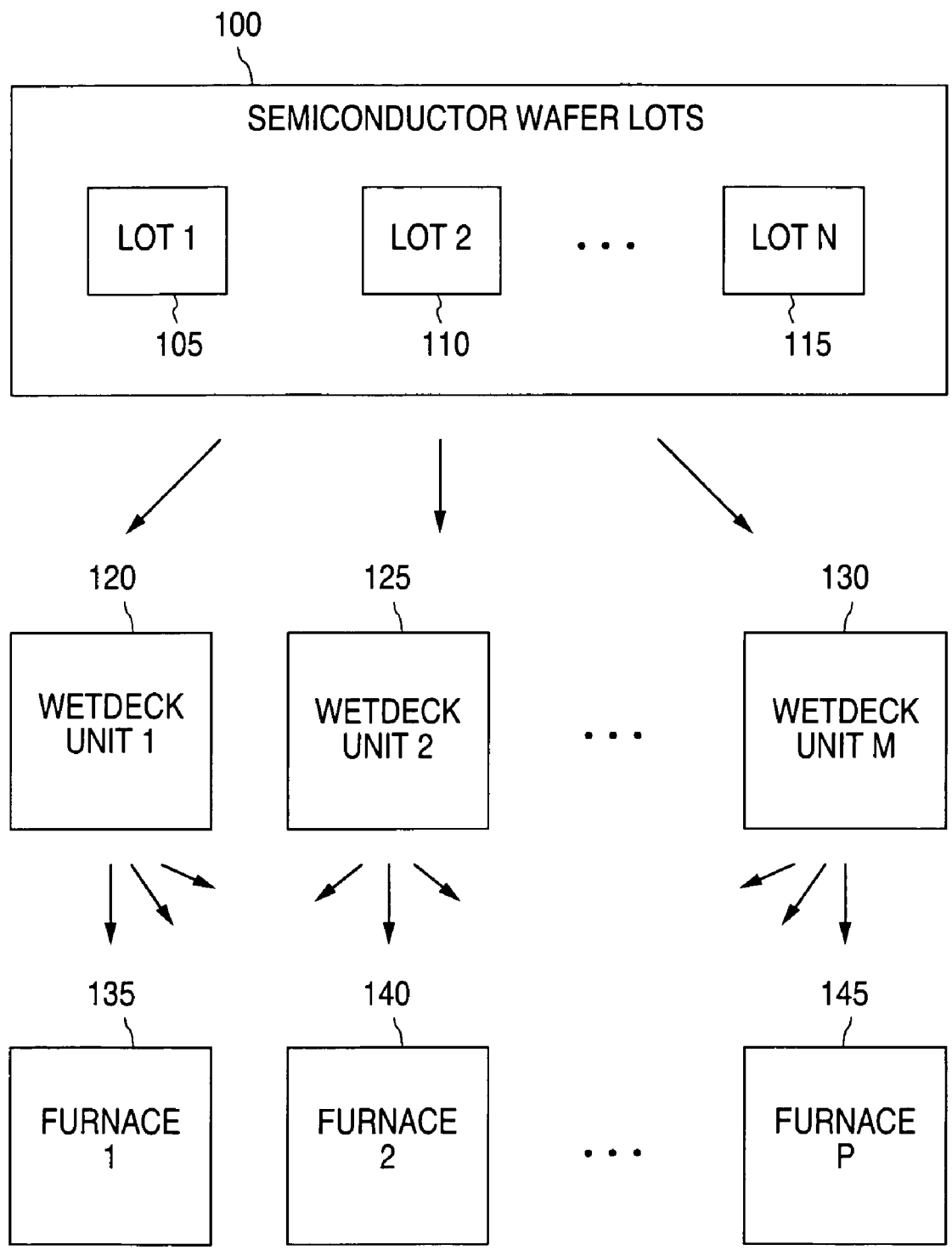
FIG. 1 schematically illustrates a portion of a prior art semiconductor wafer fabrication process showing a plurality of semiconductor wafer lots that are to be provided to a plurality of wetdeck units and a plurality of furnaces for heating the plurality of wafer lots after the wafer lots have been processed by the wetdeck units.

FIG. 1 schematically illustrates a portion of a prior art semiconductor wafer fabrication process showing a plurality 100 of N semiconductor wafer lots that are to be provided to a plurality of M wetdeck units. The plurality 100 of N wafer lots shown in FIG. 1 comprises wafer lot 1 (designated with reference numeral 105), wafer lot 2 (designated with reference numeral 110), and wafer lot N (designated with reference numeral 115). The plurality of M wetdeck units shown in FIG. 1 comprises wetdeck unit 1 (designated with reference numeral 120), wetdeck unit 2 (designated with reference numeral 125), and wetdeck unit M (designated with reference numeral 130). Any one of the plurality of wafer lots (105, 110, 115) may be assigned to any one of the plurality of wetdeck units (120, 125, 130).

After a wafer lot has been processed by a wetdeck unit, the wafer lot is sent to a furnace for heat treatment. FIG. 1 schematically illustrates a plurality of P furnaces to which the wafer lots may be sent from the wetdeck units. The plurality of P furnaces shown in FIG. 1 comprises furnace 1 (designated with reference numeral 135), furnace 2 (designated with reference numeral 140), and furnace P (designated with reference numeral 145). Any one of the plurality of wetdeck units (120, 125, 130) may send a wafer lot to any one of the plurality of furnaces (135, 140, 145).

The present invention provides a system and method for monitoring each of the plurality of furnaces (135, 140, 145) to determine the length of time that each furnace is open between successive heating runs. As previously described, it is very important that a furnace not be left open for extended periods of time between heating runs. If a furnace is left open to the atmosphere beyond a predetermined length of time (for example, fifty five (55) minutes), then the furnace will absorb too much moisture from the atmosphere. Any furnace that is left open too long must undergo a furnace cycle purge process to remove the absorbed atmospheric moisture before that furnace may again be used to heat semiconductor wafer lots.

Figure 2:
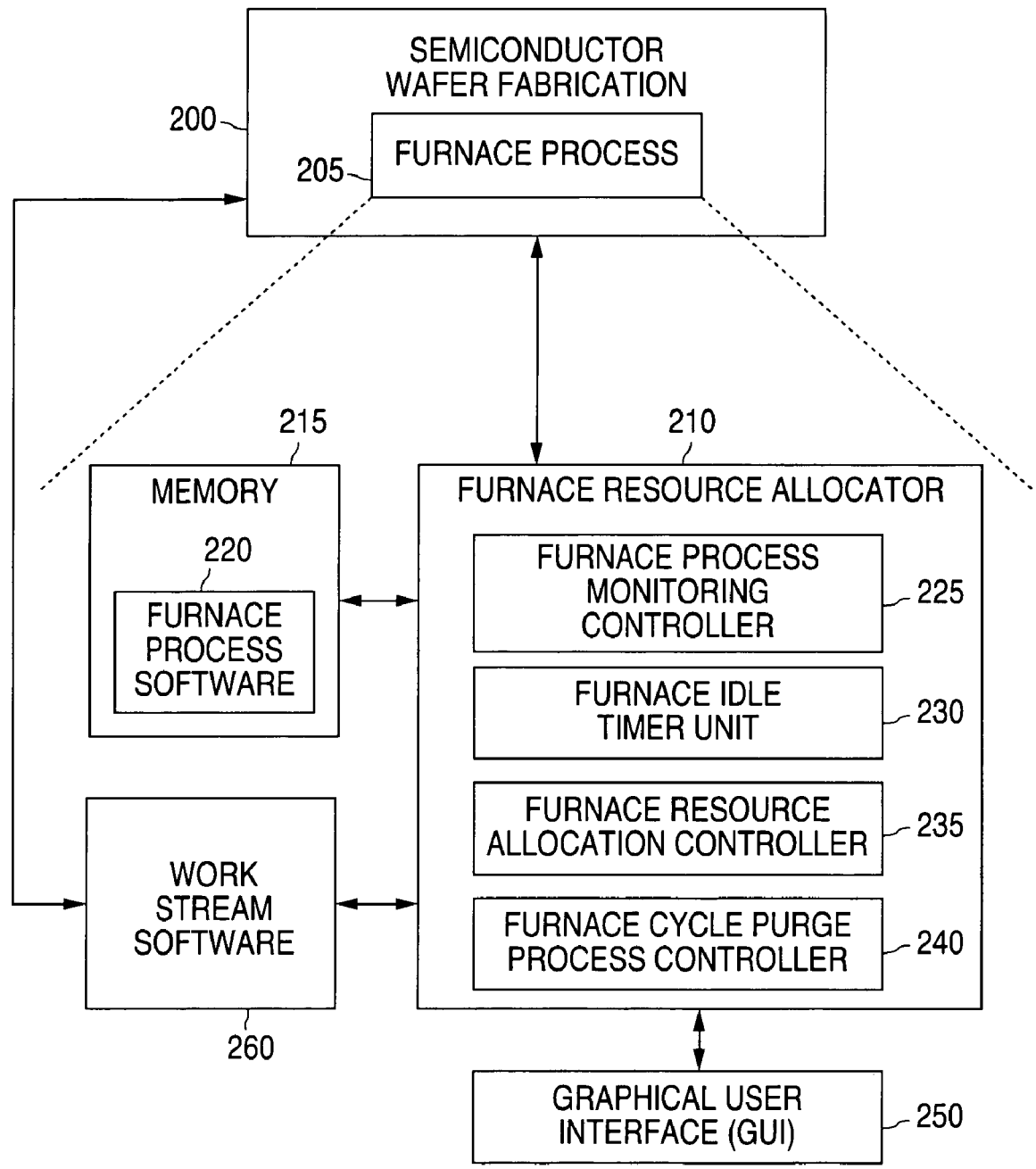
FIG. 2 illustrates a conceptual block diagram of an exemplary embodiment of a furnace resource allocator for use in a furnace process in a semiconductor wafer fabrication process according to one embodiment of the present invention.

FIG. 2 illustrates a conceptual block diagram of an exemplary embodiment of a furnace resource allocator 210 for use in a furnace process 205 in a semiconductor wafer fabrication process 200 according to one embodiment of the present invention.

The process of heating semiconductor wafer lots in a furnace during semiconductor wafer fabrication is well known and, for the purposes hereof, may again be described as a process of placing a semiconductor wafer lot into a furnace and heating the semiconductor wafer lot for a specified period of time.

According to the illustrated embodiment, furnace process 205 is operable to insert a semiconductor wafer lot into any one of the plurality of furnaces (135, 140, 145). Furnace resource allocator 210 is operable to allocate one of the furnaces (135, 140, 145) to heat a specific semiconductor wafer lot.

Furnace resource allocator 210 comprises a furnace process monitoring controller 225, a furnace idle timer unit 230, a furnace resource allocation controller 235, and a furnace cycle purge process controller 240. A graphical user interface 250 that is coupled to the furnace resource allocator 210 enables a user to communicate with and issue control commands to the furnace resource allocator 210.

Furnace resource allocator 210 is also coupled to memory 215 that comprises furnace process software 220. Furnace process software 220 is capable of operating the elements of furnace resource allocator 210. Furnace process software 220 and furnace resource allocator 210 are together capable of carrying out the steps of the method of the present invention. Furnace resource allocator 210 is also coupled to and communicates with work stream software 260. Work stream software 260 is capable of operating the elements of other processes involved in manufacturing semiconductor wafers (e.g., wetdeck process). Furnace resource allocator 210 coordinates the operation of the furnace process 205 with other processes through work stream software 260.

Furnace process monitoring controller 225 monitors measurable characteristics associated with an executing furnace task (i.e., heating run). Furnace idle timer unit 230 monitors a timer for each furnace (135, 140, 145) in order to keep track of how much time has elapsed after each furnace has completed a heating run and has been opened to the atmosphere. For example, furnace idle timer unit 230 may determine (a) that furnace 135 is currently being operated (i.e., a heating run is in progress), and (b) that furnace 140 has been open to the atmosphere for thirty (30) minutes, and (c) that furnace 145 has been open to the atmosphere for two (2) hours. As will be more fully described, the method of the invention resets the value of the respective timer of a furnace in furnace idle timer unit 230 (a) when the furnace has finished a heating run, or (b) when the furnace has completed a furnace cycle purge process.

Furnace resource allocator 210 also comprises furnace resource allocator controller 235. When a wafer lot is ready for heating, the furnace resource allocator controller 235 selects one of the available furnaces to perform the required heating run. Furnace resource allocator controller 235 then performs pre-production checks to determine if a selected furnace is capable of performing the heating run. In an advantageous embodiment of the method of the present invention, the furnace resource allocator controller 235 accesses the value of the idle time for the selected furnace from furnace idle timer unit 230. If the idle time has exceeded a preselected limit (e.g., the idle time exceeds fifty five (55) minutes), then furnace resource allocation controller 235 rejects the selected furnace and allocates a different furnace to be considered as a possible candidate for the heating run.

After an acceptable furnace has been located in which the idle time of the furnace has not exceeded the preselected limit, furnace resource allocation controller 235 assigns that furnace for the heating run. The semiconductor wafer lot is then heated in the selected furnace. After the heating run has been successfully completed, then furnace process monitoring controller 225 sends a message to work stream software 260 indicating that the heating run for the semiconductor wafer lot has been successfully completed.

Furnace process monitoring controller 225 then causes furnace idle timer unit 230 to reset the value of the idle time for the furnace that was used in the heating run. In one advantageous embodiment of the invention, the value of the idle time is reset to a value of zero. As time passes, furnace idle timer unit 230 continually records the value of the idle time to reflect how much time has elapsed since the idle time value for the furnace was reset to zero. Work stream software 260 then causes the semiconductor wafer lot to be moved out of the furnace.

When furnace resource allocation controller 235 identifies a furnace in which the idle time has exceeded the preselected time limit, furnace resource allocation controller 235 sets a requirement that the "expired" furnace undergo a furnace cycle purge process. A furnace cycle purge process purges a furnace of moisture that the furnace has absorbed from the atmosphere during the time that the furnace was open to the atmosphere. The preselected time limit is chosen so that a furnace that remains open longer than the preselected time limit will not be used until that furnace has undergone a furnace cycle purge process.

Furnace cycle purge process controller 240 controls the operation of the furnace cycle purge process. Furnace cycle purge process controller monitors the condition of the "expired" furnace during the furnace cycle purge process. After the furnace cycle purge process has been successfully completed, then furnace cycle purge process controller 240 sends a message to that effect to work stream software 260. Furnace cycle purge process controller 240 then resets the value of the idle time for the furnace that has just been successfully purged. In one advantageous embodiment of the present invention, the value of the idle time is reset to a value of zero. The successfully purged furnace is now available for use.

The system and method of the present invention provides a furnace resource allocator for use in semiconductor wafer fabrication in which the furnace resource allocator is operable (1) to monitor at least one furnace relative to a remain-open threshold, and (2) to selectively flag the at least one furnace in response thereto.

Figure 3:
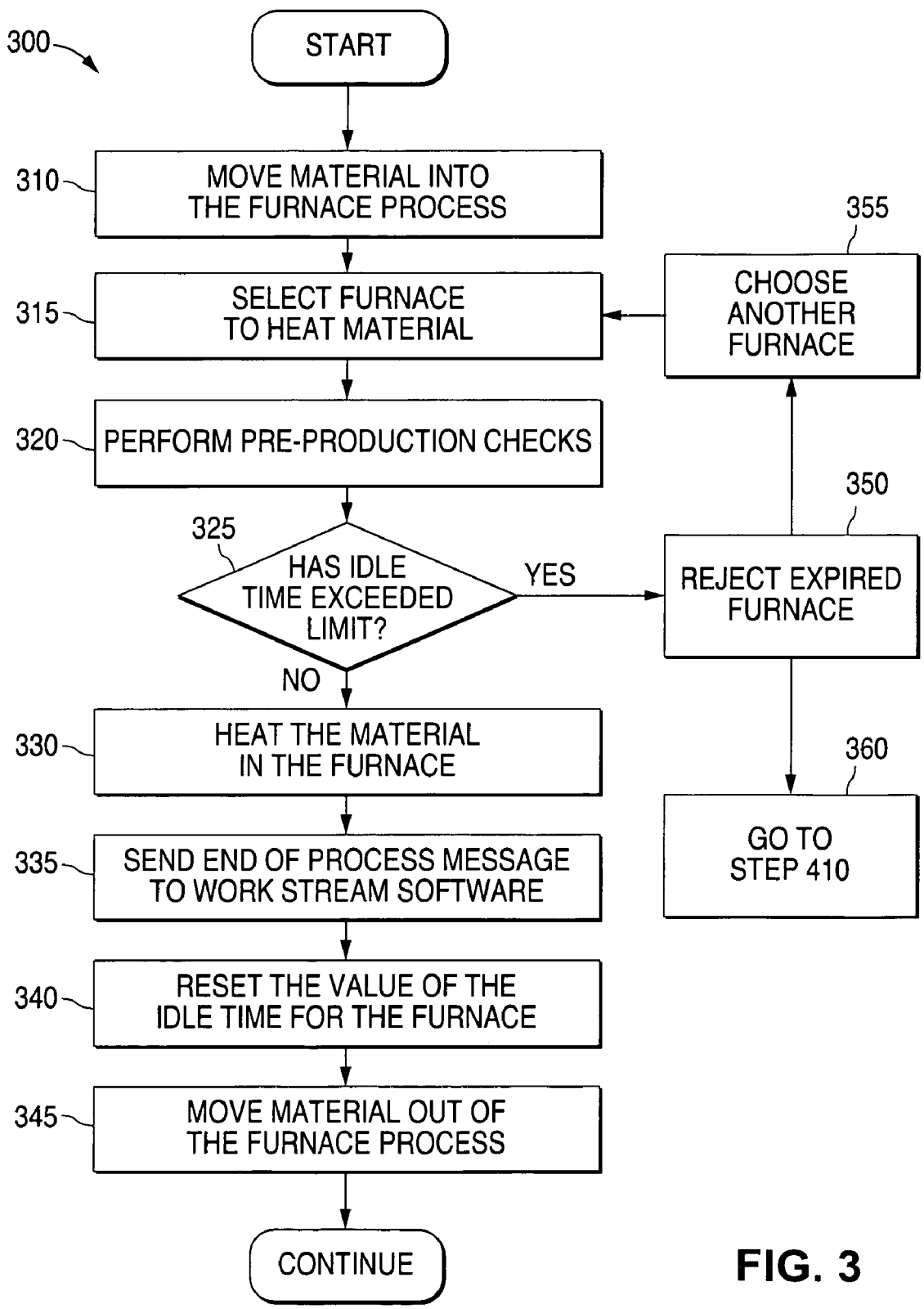
FIG. 3 illustrates a flow diagram of a first portion of an exemplary method of operating the system of the present invention.

FIG. 3 illustrates a flow diagram of a first portion of an exemplary method of operating the system of the present invention. The steps of the first portion of the method shown in FIG. 3 are collectively referred to with reference numeral 300.

In the first step, the material to be heated (such as a semiconductor wafer lot) is moved into the furnace process (step 310). The furnace resource allocator 210 selects a furnace as a candidate to perform a heating run to heat the material (step 315). Furnace resource allocator controller 235 performs pre-production checks to determine if the selected furnace candidate is capable of performing the heating run (step 320).

Furnace resource allocator controller 235 accesses the value of the idle time for the selected furnace candidate from furnace idle timer unit 230 and determines if the idle time value has exceeded a preselected limit (decision step 325). If the idle time limit has not been exceeded, then the material is heated in the furnace (step 330). After the heating run has been successfully completed, furnace process monitoring controller 225 sends a message to that effect to work stream software 260.

Furnace process monitoring controller 225 then causes furnace idle timer unit 230 to reset the value of the idle time for the furnace that was used in the heating run (step 340). Then the successfully heated material is moved out of the furnace process (step 345).

If a determination is made in decision step 325 that the value of the idle time for the selected furnace candidate has exceeded the preselected idle time limit, then the selected furnace candidate is rejected (step 350). Then furnace resource allocator 210 chooses another furnace as a furnace candidate (step 355) and selects that furnace candidate to heat the material (step 315). The method of the invention continues to search for a suitable furnace candidate until one is found. If no suitable furnace candidate is found, then the heating process will be suspended until at least one furnace can be reconditioned using a furnace cycle purge process.

Figure 4:
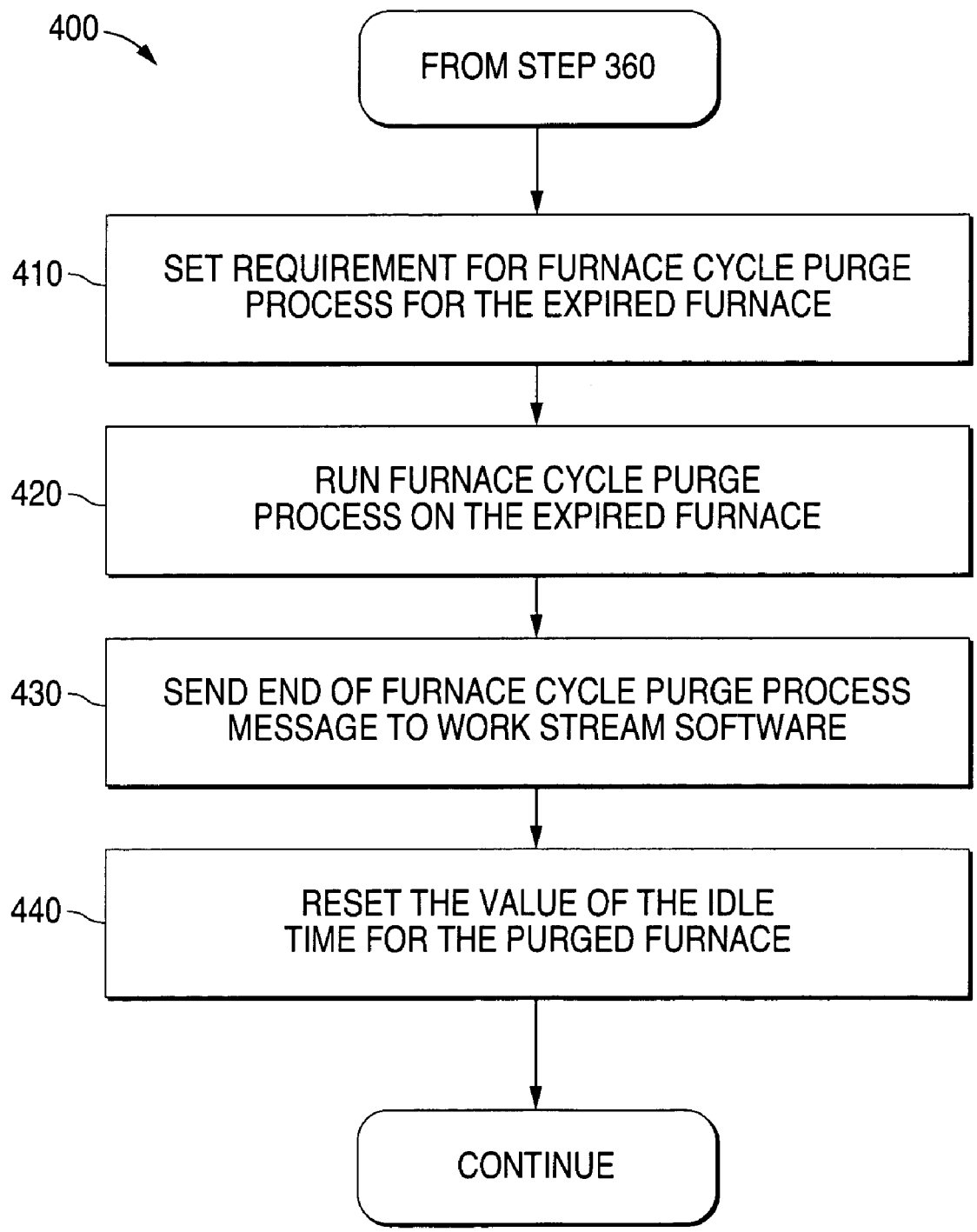
FIG. 4 illustrates a flow diagram of a second portion of an exemplary method of operating the system of the present invention.

When a furnace candidate is rejected because the value of its idle time has exceeded the preselected idle time limit, that furnace is a candidate for undergoing a furnace cycle purge process. As shown in FIG. 3 and FIG. 4 the method of the invention passes a control signal passes from step 350 to step 410.

FIG. 4 illustrates a flow diagram of a second portion of an exemplary method of operating the system of the present invention. The steps of the second portion of the method shown in FIG. 4 are collectively referred to with reference numeral 400.

In the first step of the second portion of the method, furnace resource allocation controller 235 sets a requirement that the "expired" furnace undergo a furnace cycle purge process (step 410). Furnace cycle purge process controller 240 controls the operation of the furnace cycle purge process. Furnace cycle purge process controller 240 runs the furnace cycle purge process on the "expired" furnace (step 420).

After the furnace cycle purge process has been successfully completed, then furnace cycle purge process controller 240 sends a message to that effect to work stream software 260 (step 430). Furnace cycle purge process controller 240 then causes furnace idle timer unit 230 to reset the value of the idle time for the furnace that has just been successfully purged (step 440).

After a previously "expired" furnace has been successfully purged, the furnace is then once again available to be a suitable candidate furnace in the method of the invention.

In summary, to address the deficiencies of the prior art, the present invention provides a system and method that is capable of rejecting a furnace for carrying out a furnace task in a semiconductor wafer fabrication process when the furnace has been open to the atmosphere longer than a predetermined length of time.

A furnace resource allocator of the present invention is operable to allocate a plurality of furnaces to a plurality of furnace tasks. The furnace resource allocator is capable of rejecting a furnace that has been selected as a furnace candidate if the furnace has been open too long. The furnace resource allocator of the present invention comprises a furnace process monitoring controller, a furnace idle timer unit, a furnace resource allocation controller, and a furnace cycle purge process controller. A suitably arranged graphical user interface is associated with the furnace resource allocator.

The furnace idle time unit comprises a plurality of timers. Each timer is associated with one of the plurality of furnaces. Each timer records the amount of time that has elapsed since its respective furnace has been idle. The furnace resource allocation controller (1) selects a furnace from the plurality of furnaces, (2) obtains from the furnace idle timer unit a value of the time that has elapsed since the selected furnace has been open, and (3) rejects the selected furnace from carrying out a furnace task if the value of the elapsed time for the selected furnace is greater than a predetermined length of time. The selected furnace is not rejected if the elapsed idle time is less than the predetermined length of time. In one advantageous embodiment of the invention, the predetermined length of time is fifty-five minutes.

The furnace process monitoring controller monitors measurable characteristics associated with an executing furnace task. The furnace cycle purge process controller controls the operation of the furnace cycle purge process. Any furnace that has been rejected because it was open too long is subjected to the furnace cycle purge process. After a furnace has been successfully purged, the furnace cycle purge process controller causes furnace idle timer unit to reset the timer for the newly purged furnace.

It is an object of the invention to provide a system and method that is capable of rejecting a furnace for carrying out a furnace task in a semiconductor wafer fabrication process when the furnace has been open to the atmosphere longer than a predetermined length of time.

It is another object of the invention to provide a system and method that is capable of monitoring at least one furnace relative to a remain-open threshold, and selectively flagging the at least one furnace in response thereto.

It is also an object of the invention to provide a system and method that is capable of monitoring the idle status of a each of a plurality of furnaces in a semiconductor wafer fabrication process.

It is yet another object of the invention to provide a system and method that is capable of using the idle status of each of a plurality of furnaces to allocate the plurality of furnaces to a plurality of furnace tasks in a semiconductor wafer fabrication process.

It is also another object of the invention to provide a system and method that is capable of identifying one or more furnaces in a semiconductor wafer fabrication process that must undergo a furnace cycle purge process before being assigned to a furnace task.

The foregoing has outlined the features and technical advantages of the present invention so that those skilled in the art may understand the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

What is claimed is:

1. A furnace resource allocator for use in semiconductor wafer fabrication, wherein said furnace resource allocator is operable to monitor at least one furnace relative to a remain-open threshold and to allocate said at least one furnace to at least one furnace task in response thereto, the remain-open threshold associated with an amount of time the at least one furnace is allowed to remain open.

2. A furnace resource allocator operable to allocate a plurality of furnaces to a plurality of furnace tasks within a furnace process system in semiconductor wafer fabrication, said furnace resource allocator comprising:
a furnace idle timer unit that comprises a plurality of timers, wherein each timer is associated with one of said plurality of furnaces, and wherein each timer records an amount of time that has elapsed since its respective furnace was opened; and
a furnace resource allocation controller that is capable of:
selecting a furnace from said plurality of furnaces;
obtaining from said furnace idle timer unit a value of said elapsed time since said selected furnace was opened; and
rejecting said selected furnace for carrying out a furnace task if said value of elapsed time for said selected furnace is greater than a specified length of time.

3. The furnace resource allocator as set forth in claim 2 wherein said specified length of time is fifty five minutes.

4. The furnace resource allocator as set forth in claim 2 further comprising a graphical user interface that is operable to send signals from a user to said furnace resource allocator and to send signals from said furnace resource allocator to said user.

5. The furnace resource allocator as set forth in claim 2 wherein said furnace resource allocation controller is capable of performing pre-production checks on each furnace that is selected to carry out a furnace task.

6. The furnace resource allocator as set forth in claim 2 wherein:
said selected furnace comprises a first selected furnace, and said furnace resource allocation controller is capable of selecting a second furnace from said plurality of furnaces for carrying out the furnace task after the first selected furnace has been rejected.

7. The furnace resource allocator as set forth in claim 2 further comprising a furnace process monitoring controller that is capable of monitoring measurable characteristics associated with an executing furnace task.

8. The furnace resource allocator as set forth in claim 7 wherein said furnace process monitoring controller is capable of at least one of:
sending a message to work stream software associated with said furnace resource allocator to inform said work stream software than the executing furnace task has been successfully completed; and
causing said furnace idle timer unit to reset the value of elapsed time for the furnace that has successfully completed the executing furnace task.

9. The furnace resource allocator as set forth in claim 2 further comprising a memory unit that comprises furnace process software that is capable of operating elements of said furnace resource allocator.

10. The furnace resource allocator as set forth in claim 2 further comprising a furnace cycle purge process controller that is capable of executing a furnace cycle purge process on a furnace to purge said furnace of moisture that said furnace absorbed when said furnace was open.

11. The furnace resource allocator as set forth in claim 10 wherein said furnace cycle purge process controller is capable of causing said furnace idle timer unit to reset the value of elapsed time for the furnace that has successfully completed the furnace cycle purge process.

12. A method of operating a furnace resource allocator in semiconductor wafer fabrication, comprising the steps of:
monitoring at least one furnace relative to a remain-open threshold; and
allocating said at least one furnace to at least one furnace task in response thereto;
wherein the remain-open threshold is associated with an amount of time the at least one furnace is allowed to remain open.

13. A method of operating a furnace resource allocator in semiconductor wafer fabrication, comprising the steps of:
recording in a furnace idle timer unit, for each furnace of a plurality of furnaces, an amount of time that has elapsed since each furnace was opened;
selecting a furnace from said plurality of furnaces;
obtaining from said furnace idle timer unit a value of said elapsed time since said selected furnace was opened; and
rejecting said selected furnace for carrying out a furnace task if said value of elapsed time for said selected furnace is greater than a specified length of time.

14. The method as set forth in claim 13 wherein said specified length of time is fifty five minutes.

15. The method as set forth in claim 13 further comprising the steps of:
sending signals from a user to said furnace resource allocator through a graphical user interface; and
sending signals from said furnace resource allocator to said user through said graphical user interface.

16. The method as set forth in claim 13 further comprising the step of:
performing pre-production checks on each furnace that is selected to carry out a furnace task.

17. The method as set forth in claim 13 wherein said selected furnace comprises a first selected furnace, and further comprising the step of:
selecting a second furnace from said plurality of furnaces for carrying out the furnace task after the first selected furnace has been rejected.

18. The method as set forth in claim 13 further comprising the step of:
monitoring measurable characteristics associated with an executing furnace task with a furnace process monitoring controller.

19. The method as set forth in claim 18 further comprising the steps of:
sending a message from said furnace process monitoring controller to work stream software associated with said furnace resource allocator to inform said work stream software that the executing furnace task has been successfully completed; and
causing said furnace idle timer unit to reset the value of elapsed time for the furnace that has successfully completed the executing furnace task.

20. The method as set forth in claim 13 wherein said resource allocation controller further comprises a memory unit that comprises furnace process software that is capable of operating elements of said furnace resource allocator.

21. The method as set forth in claim 13 further comprising the step of:

executing a furnace cycle purge process on a furnace to purge said furnace of moisture that said furnace absorbed when said furnace was open.

22. The method as set forth in claim 21 further comprising the step of:

causing said furnace idle timer unit to reset the value of elapsed time for the furnace that has successfully completed the furnace cycle purge process.

\* \* \* \* \*